(12) United States Patent
Tung et al.

(10) Patent No.: US 9,218,986 B2
(45) Date of Patent: Dec. 22, 2015

(54) HARD MASK EDGE COVER SCHEME

(71) Applicant: Taiwan Semiconductor Manufacturing Company, Ltd., Hsin-Chu (TW)

(72) Inventors: Szu-Ping Tung, Taipei (TW); Huang-Yi Huang, Hsin-Chu (TW); Chih-Chien Chi, Hsin-Chu (TW); Ching-Hua Hsieh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 101 days.

(21) Appl. No.: 14/024,045

(22) Filed: Sep. 11, 2013

(65) Prior Publication Data

US 2015/0072528 A1    Mar. 12, 2015

(51) Int. Cl.
  *H01L 21/00* (2006.01)
  *H01L 21/311* (2006.01)

(52) U.S. Cl.
  CPC .................. *H01L 21/31144* (2013.01)

(58) Field of Classification Search
  CPC ............ H01L 21/7684; H01L 21/6843; H01L 23/5226; H01L 21/31144
  See application file for complete search history.

(56) References Cited

U.S. PATENT DOCUMENTS 5,950,108 A * 9/1999 Wu et al. .................. 438/685
  2010/0040982 A1* 2/2010 Liu et al. .................. 430/314

\* cited by examiner

*Primary Examiner* — Richard Booth
(74) *Attorney, Agent, or Firm* — Slater & Matsil, L.L.P.

(57) ABSTRACT

A method includes forming at least one trench in a dielectric layer using a hard mask. An edge cover layer is formed over the hard mask. The at least one trench is filled with a metal layer.

20 Claims, 2 Drawing Sheets

HARD MASK EDGE COVER SCHEME

TECHNICAL FIELD

The present disclosure relates generally to an integrated circuit and more particularly to a hard mask edge cover scheme.

BACKGROUND

In some fabrication processes, a hard mask is used to improve etching selectivity relative to dielectric material. However, the hard mask (e.g., a metal hard mask) can shrink on the edges (i.e., hard mask pullback) after dry etching and wet cleaning processes. During a seed metal layer deposition afterwards, the hard mask pullback may cause undesirable overhang on the structure that reduces opening of the trench formed below, which interferes with metal filling.

BRIEF DESCRIPTION OF THE DRAWINGS

Reference is now made to the following descriptions taken in conjunction with the accompanying drawings, in which.

DETAILED DESCRIPTION

Figure 1:
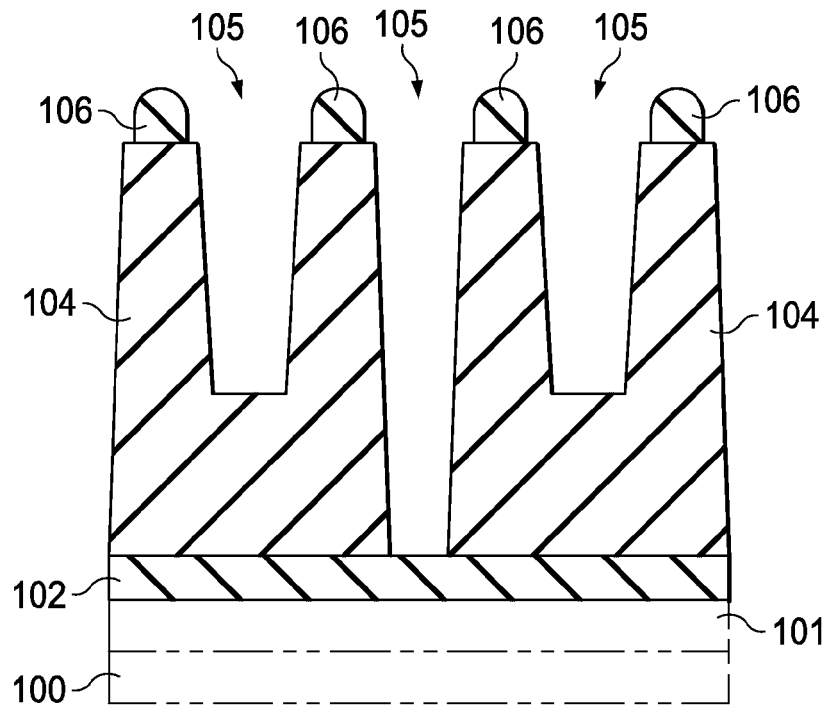
FIGS. 1-4 are intermediate steps of an exemplary hard mask edge cover scheme according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIGS. 1-4 are intermediate steps of an exemplary hard mask edge cover scheme according to some embodiments. In FIG. 1, a dielectric layer 104 and an etch stop layer 102 are disposed over a substrate 100 and an intermediate layer 101. The substrate 100 comprises silicon, silicon dioxide, aluminum oxide, sapphire, germanium, gallium arsenide (GaAs), an alloy of silicon and germanium, indium phosphide (InP), silicon on insulator (SOI), or any other suitable material. The substrate 100 may further include additional features or layers to form various devices and functional features. The intermediate layer 101 may include a metal layer, a dielectric layer, or any additional layer in some embodiments. The substrate 100 and the intermediate layer 101 shown in dotted lines in FIG. 1 are omitted in the following figures for simplicity.

The etch stop layer 102 comprises SiO, SiC, SiN, SiOC, SiON, SiCN, TiN, $AlO_xN_y$, or any other suitable material with a thickness ranging from 30 Å to 300 Å, and can be formed over the substrate 100 by chemical vapor deposition (CVD) in some embodiments. The dielectric layer 104 comprises $SiO_2$ or any other suitable material with a thickness ranging from 500 Å to 2,000 Å, and can be formed over the etch stop layer 102 by CVD in some embodiments.

A hard mask 106 is formed over the dielectric layer 104. In some embodiments, the hard mask comprises TiN and is deposited over the dielectric layer 104 by a physical vapor deposition (PVD), CVD or sputtering and patterned by a photolithography process. The hard mask 106 has a thickness ranging from 100 Å to 400 Å in some embodiments. Trenches 105 are formed in the dielectric layer 104 by dry etching using the hard mask 106 and wet cleaning, for example. As shown in FIG. 1, hard mask 106 shrinks or pulls back from edges of trenches 105 as a result of the processing steps to form the trenches.

Figure 2:
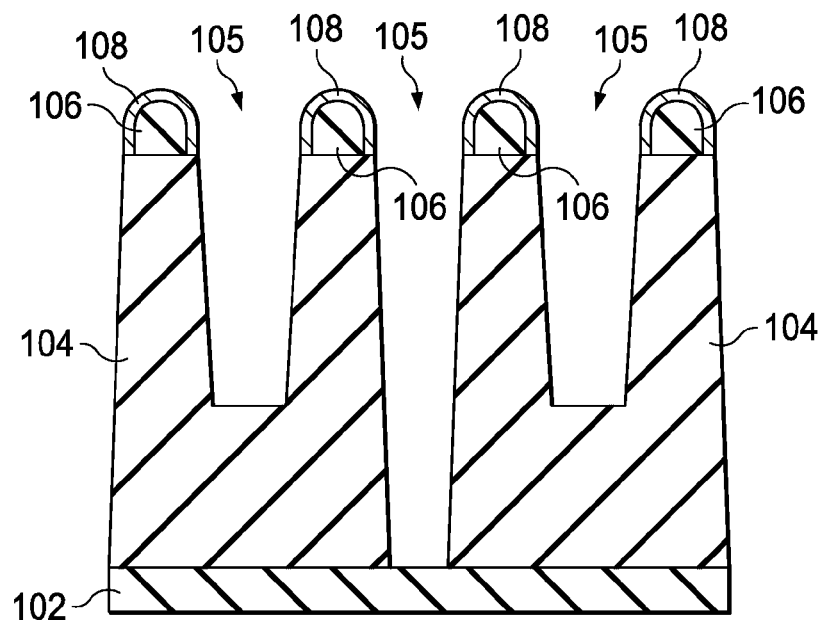

In FIG. 2, an edge cover layer 108 is formed over the hard mask 106. The edge cover layer 108 fills the corners of the hard mask 106 at the junction with the dielectric layer 104. The sidewall of the edge cover layer 108 is generally aligned with the sidewall of the trench 105 for a smooth profile in some embodiments.

The edge cover layer 108 comprises Co, Cu, W, Al, Mn, Ru, Ta, any combination thereof, or any other suitable material. The edge cover layer 108 has a thickness that is less 500 Å and ranges from 5 Å to 50 Å in some embodiments. The edge cover layer 108 can be selectively deposited over the hard mask 106 by PVD, CVD, atomic layer deposition (ALD) at a temperature ranging from a room temperature to about 400° C. and a pressure ranges from about 0 Torr to about 100 Torr in some embodiments. A plasma-enhanced CVD (PECVD) or plasma-enhanced ALD (PEALD) can be used in some embodiments.

The reaction mechanism of deposited area over the hard mask 106 and non-deposited area over the dielectric layer 104 can be different in various embodiments. It may use a different pre-treatment process, chemical property, or additional remove process, to selectively grow the edge cover layer 108. For example, the difference of surface property would cause different reactions between a metal and a dielectric layer.

In one example, a Co layer can be deposited by a selective CVD process at a temperature ranging from room temperature to about 400° C. and a pressure ranging from about 0 Torr to about 100 Torr.

In other embodiments, the surface condition can be modified by plasma surface treatment using $H_2$, $O_2$, Ar, $NH_3$ (or any other suitable plasma) at a temperature ranging from room temperature to 400° C. and a pressure ranging from 0 Torr to 1000 mTorr. For example, a selective Co deposition by CVD can be done after a plasma surface treatment using $H_2$ and $NH_3$, or a selective Ru deposition by CVD can be done after the plasma surface treatment using a pre-treatment gas containing CO.

In yet other embodiments, the edge cover layer 108 can be deposited uniformly and then the portion in undesired locations (i.e. on the dielectric layer 104) can be removed by $H_2$, $O_2$, Ar, $NH_3$, or any other suitable plasma. For example, a CVD process of AlOxNy can form AlxNy on a metal layer and AlOxNy on a dielectric layer by the precursor trimethylaluminum (Al(CH$_3$)$_3$). And AlOxNy on the dielectric layer may be removed by H$_2$, O$_2$, Ar, NH$_3$, or any other suitable plasma.

In some embodiments, a barrier layer (not shown) may be formed over the dielectric layer 104 before a seed layer 110 (see FIG. 3) is formed. The barrier layer may help to block diffusion of the subsequently formed metal layer 112 (see FIG. 4) into adjacent dielectric layer 104. The barrier layer comprises titanium, titanium nitride, tantalum, tantalum nitride, manganese, manganese oxide, cobalt, cobalt nitride, or any other suitable material. The barrier layer may be formed by PVD, CVD, PECVD, or ALD in some embodiments.

Figure 3:
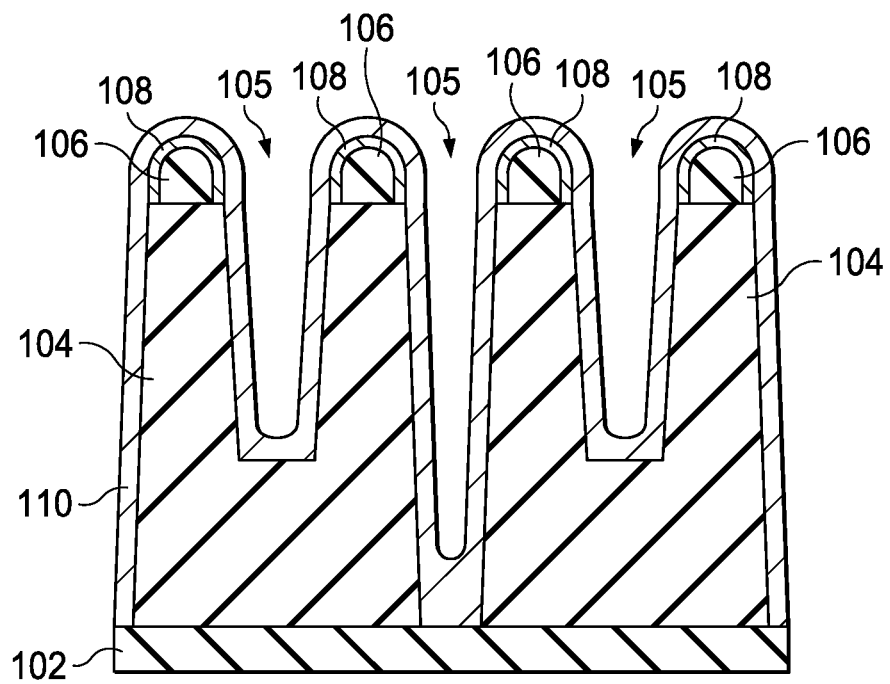

In FIG. 3, a seed layer 110 is deposited over the edge cover layer 108 and the trenches 105 in the dielectric layer 104 (or deposited over the barrier layer, if the barrier layer is formed before). For example, a Cu seed layer 110 can be formed by PVD with a thickness ranging from 2 nm to 60 nm. By having a smooth profile between the sidewalls of the trenches 105 of the dielectric layer 104 and the edge cover layer 108 covering the hard mask 106, there is less overhang structure resulting after the seed layer 110 (and the barrier layer) formation around the junction of the hard mask 106 and the dielectric layer 104. By using the edge cover layer 108, larger top openings in the trenches 105 remain for metal filling in the next step.

Figure 4:
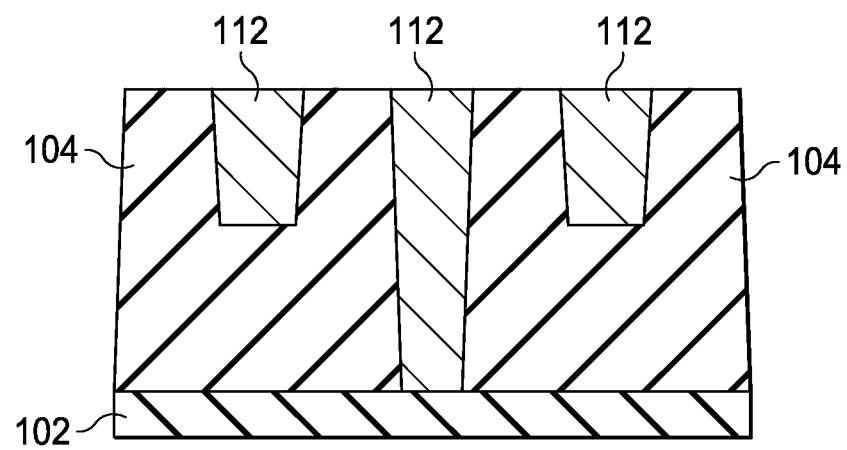

In FIG. 4, a metal layer 112 is formed by filling in the trenches 105. In some embodiments, the metal layer 112 comprises Cu, Al, or any other suitable metal. For example, Cu can be deposited using an electrochemical plating process with a thickness around 200 nm-700 nm. Due to the unobstructed openings of the trenches 105 after seed layer 110 formation, the metal layer 112 filling can be done more efficiently. After the metal layer 112 filling, a polishing process such as chemical mechanical polishing can be performed to remove unwanted layers including the hard mask 106 and the edge cover layer 108.

According to some embodiments, a method includes forming at least one trench in a dielectric layer using a hard mask. An edge cover layer is formed over the hard mask. The at least one trench is filled with a metal layer.

According to some embodiments, a method includes forming at least one trench in a dielectric layer using a hard mask. An edge cover layer is formed over the hard mask by a selective deposition process. The at least one trench is filled with a metal layer. A polishing process is performed.

According to some embodiments, a method includes forming a hard mask over a dielectric layer. At least one trench is formed in the dielectric layer using the hard mask. An edge cover layer is formed over the hard mask by a selective deposition process. A seed layer is formed over the at least one trench. The at least one trench is filled with a metal layer. A polishing process is performed.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method, comprising:
    forming a patterned hard mask over a dielectric layer;
    etching at least one trench in the dielectric layer using the hard mask, wherein a recess is formed between a sidewall of the patterned hard mask and a sidewall of the trench;
    forming an edge cover layer over the hard mask, the edge cover filling the recess; and
    filling the at least one trench with a metal layer.

2. The method of claim 1, wherein a first sidewall of the edge cover layer is generally aligned with a second sidewall of the at least one trench.

3. The method of claim 1, further comprising forming a seed layer over the at least one trench prior to filling.

4. The method of claim 1, further comprising performing a polishing process.

5. The method of claim 1, wherein the edge cover layer is formed by a selective deposition process.

6. The method of claim 5, wherein the selective deposition process comprises a chemical vapor deposition (CVD), a physical vapor deposition (PVD), or atomic layer deposition (ALD).

7. The method of claim 1, further comprising performing a plasma surface treatment of the dielectric layer and the hard mask.

8. The method of claim 7, wherein the plasma surface treatment uses H$_2$, O$_2$, Ar, NH$_3$, or any combination thereof.

9. The method of claim 1, further comprising plasma etching the edge cover layer.

10. The method of claim 9, wherein the plasma etching uses H$_2$, O$_2$, Ar, NH$_3$, or any combination thereof.

11. The method of claim 1, wherein the edge cover layer comprises Co, Cu, W, Al, Mn, Ru, Ta, or any combination thereof.

12. The method of claim 1, further comprising forming the hard mask over the dielectric layer by a process selected from the group consisting of physical vapor deposition, chemical vapor deposition, and sputtering.

13. A method, comprising:
    forming at least one trench in a dielectric layer using a hard mask;
    forming an edge cover layer over the hard mask by a selective deposition process, wherein the edge cover extends over the hard mask but does not extend into the trench;
    filling the at least one trench with a metal layer; and
    performing a polishing process.

14. The method of claim 13, further comprising forming a seed layer over the at least one trench prior to filling.

15. The method of claim 13, further comprising performing a plasma surface treatment of the dielectric layer and the hard mask.

16. The method of claim 13, further comprising plasma etching the edge cover layer.

17. The method of claim 13, further comprising forming the hard mask over the dielectric layer.

18. The method of claim 13, wherein the selective deposition process comprises a chemical vapor deposition (CVD), a physical vapor deposition (PVD), or atomic layer deposition (ALD).

19. The method of claim 13, wherein the selective deposition process is performed at a temperature ranging from a room temperature to 400° C.

20. A method, comprising:
   forming a hard mask over a dielectric layer;
   forming at least one trench in the dielectric layer using the hard mask;
   forming an edge cover layer over the hard mask by a selective deposition process;
   forming a seed layer over the at least one trench;
   filling the at least one trench with a metal layer; and
   performing a polishing process.

\* \* \* \* \*